United States Patent

Schrader et al.

[11] Patent Number: 5,847,582
[45] Date of Patent: Dec. 8, 1998

[54] APPARATUS AND METHOD FOR PRODUCING SYMMETRIC CAPTURE RANGE IN TWO-QUADRANT PHASE DETECTOR PLLS USING NONSYMMETRIC PULSE WAVES

[75] Inventors: Victor P. Schrader, Palo Alto; Steve Hobrecht, Los Altos, both of Calif.

[73] Assignee: National Semiconductor Corporation, Santa Clara, Calif.

[21] Appl. No.: 902,863

[22] Filed: Jul. 30, 1997

Related U.S. Application Data

[63] Continuation of Ser. No. 679,189, Jul. 12, 1996, abandoned, which is a continuation of Ser. No. 570,708, Dec. 11, 1995, abandoned, which is a continuation of Ser. No. 306,649, Sep. 15, 1994, abandoned.

[51] Int. Cl.$^6$ ........................................................ H03L 7/08
[52] U.S. Cl. ............................ 327/3; 327/12; 327/156; 327/147; 327/2; 331/27
[58] Field of Search ...................... 327/165, 166, 327/141, 147, 244, 156, 2, 3, 12, 170, 116, 40, 49, 7, 8, 24, 355, 159, 150; 331/27

[56] References Cited

U.S. PATENT DOCUMENTS

| | | | |
|---|---|---|---|
| 4,464,771 | 8/1984 | Sorensen | 327/157 |
| 4,577,163 | 3/1986 | Culp | 327/159 |
| 5,192,915 | 3/1993 | Mathieu et al. | 327/156 |

*Primary Examiner*—Dinh Le
*Attorney, Agent, or Firm*—Limbach & Limbach L.L.P.

[57] ABSTRACT

A symmetric capture range is produced in a two-quadrant phase detector phase locked loop that utilizes nonsymmetric pulse waves. The phase detector is enabled only during VCO pulses. A latch stores the relative relationship between the leading edge of the input pulse and the center of the VCO pulse in the previous cycle. If the phase angle θ form the VCO pulse center to the leading edge of the input pulse is 0 deg<θ<180 deg, then the phase detector incrementally decreases the VCO frequency at the next VCO pulse. If the phase angle θ is 180 deg<θ<360 deg, then the phase detector incrementally increases the VCO frequency at the next VCO pulse.

2 Claims, 6 Drawing Sheets

APPARATUS AND METHOD FOR PRODUCING SYMMETRIC CAPTURE RANGE IN TWO-QUADRANT PHASE DETECTOR PLLS USING NONSYMMETRIC PULSE WAVES

This is a continuation of application Ser. No. 08/679,189 filed on Jul. 12, 1996, now abandoned which is a continuation of 08/570,708 filed on Dec. 11, 1995, now abandoned which is a continuation of Ser. No. 08/306,649, filed Sep. 15, 1994, now abandoned.

FIELD OF THE INVENTION

The present invention relates to phase locked loops (PLL) and, in particular, to utilization of the relative relationship between the input pulse leading edge and the center of the VCO pulse to produce symmetric capture range in phase locked loops which must lock to non-symmetric pulse waves using a two-quadrant multiplier type phase detector.

Discussion of the Prior Art

When pulse signals must be phase-locked in a PLL, one of two types of phase detectors is typically used. The edge triggered digital phase detector of the type used in the National Semiconductor Corp. MM74HC4046 product has certain advantages, but suffers from poor noise immunity and deadband problems. On the other hand, the two-quadrant multiplier of the type used in the National Semiconductor Corp. LM1391 product has good noise immunity and no deadband, but has, in this type of application, an asymmetric capture range, i.e. one not evenly distributed around the VCO free-running frequency.

One solution to this problem is to integrate the pulse input so that it becomes a sawtooth waveform. However, active integration in an integrated circuit is subject to noise problems due to the relatively small current needed and the concomitant degradation of the precise timing information inherent in an edge. If passive integration is used, then the required pulse input must have an amplitude many times greater than the resultant sawtooth, and the filter components required are too large to be integrated on an integrated circuit. The LM1391 device uses passive integration.

FIGS. 1(a)–1(f) show a series of "snapshots" of an out-of-lock video deflection PLL using a standard two-quadrant phase detector. The phase detector is enabled during VCO pulses only, and has a high impedance output at all other times. In FIGS. 1(a)–1(f), the VCO frequency is lower than the H SYNC IN frequency; thus, for lock to be achieved, the phase detector (PD) must cause the VCO input voltage to increase.

In FIG. 1(a), the PD is sinking current, thereby discharging the loop filter. In FIGS. 1(b) and 1(c), the PD sinks current before the leading edge of H SYNC IN, and sources current during the H SYNC pulse. The net charge delivered to the loop filter is negative for FIG. 1(b), positive for FIG. 1(c). In FIG. 1(d), the PD is injecting charge only. In FIGS. 1(e) and 1(f) the net charge is again negative.

Thus, the phase detector injects charge to the filter whenever the pulses are coincident and removes charge when they are not. Over many cycles, as the VCO phase drifts in relation to the input signal, the pulses are non-coincident far more often than coincident. Thus, in the balance, the phase detector removes more charge than it injects, and the VCO frequency decreases. When out of lock, the phase detector pulls down far more effectively than it pulls up.

FIGS. 2(a) and 2(b) show oscilloscope photos of this phenomenon. The phase detector output, PD1.DC is shown as the top trace. Note that the loop filter includes a resistor to an AC ground. The angled lines in FIGS. 2(a), 2(b) represent RC relaxation curves between VCO pulses. The much fainter, nearly-vertical traces connecting the angled traces are the periods during which the phase detector is enabled, that is, during VCO pulses. The FIG. 2(a) photo shows the phase detector pulling down 12 times, and pulling up only 2 times, for each 'difference frequency' cycle.

If H SYNC IN were a square wave, then the capture range would be made symmetric, since for any given difference frequency, the pulses would coincide just as often as not. However, this is not a practical solution. Since the frequency of the input is unknown until the loop locks, it is rather difficult to multiply the frequency by two so that the period can be bisected.

SUMMARY OF THE INVENTION

The present invention produces a symmetric capture range in a two-quadrant phase detector phase locked loop that utilizes nonsymmetric pulse waves. the phase detector is enabled only during VCO pulses. A latch stores the relative relationship between the leading edge of the input pulse and the center of the VCO pulse in the previous cycle. If the phase angle θ from the VCO pulse center to the leading edge of the input pulse is $$0 \deg < \theta < 180 \deg,$$

then the phase detector incrementely reduces the VCO frequency at the next VCO pulse. If the phase angle θ from the VCO pulse center to the leading edge of the input pulse is $$180 \deg < \theta < 360 \deg,$$

then the phase detector incrementely increases the VCO frequency at the next VCO pulse.

A better understanding of the features and advantages of the present invention may be obtained by reference to the following detailed description and the accompanying drawings which set forth an illustrative embodiment in which the principles of the invention are utilized.

DETAILED DESCRIPTION OF THE INVENTION

Figure 3:
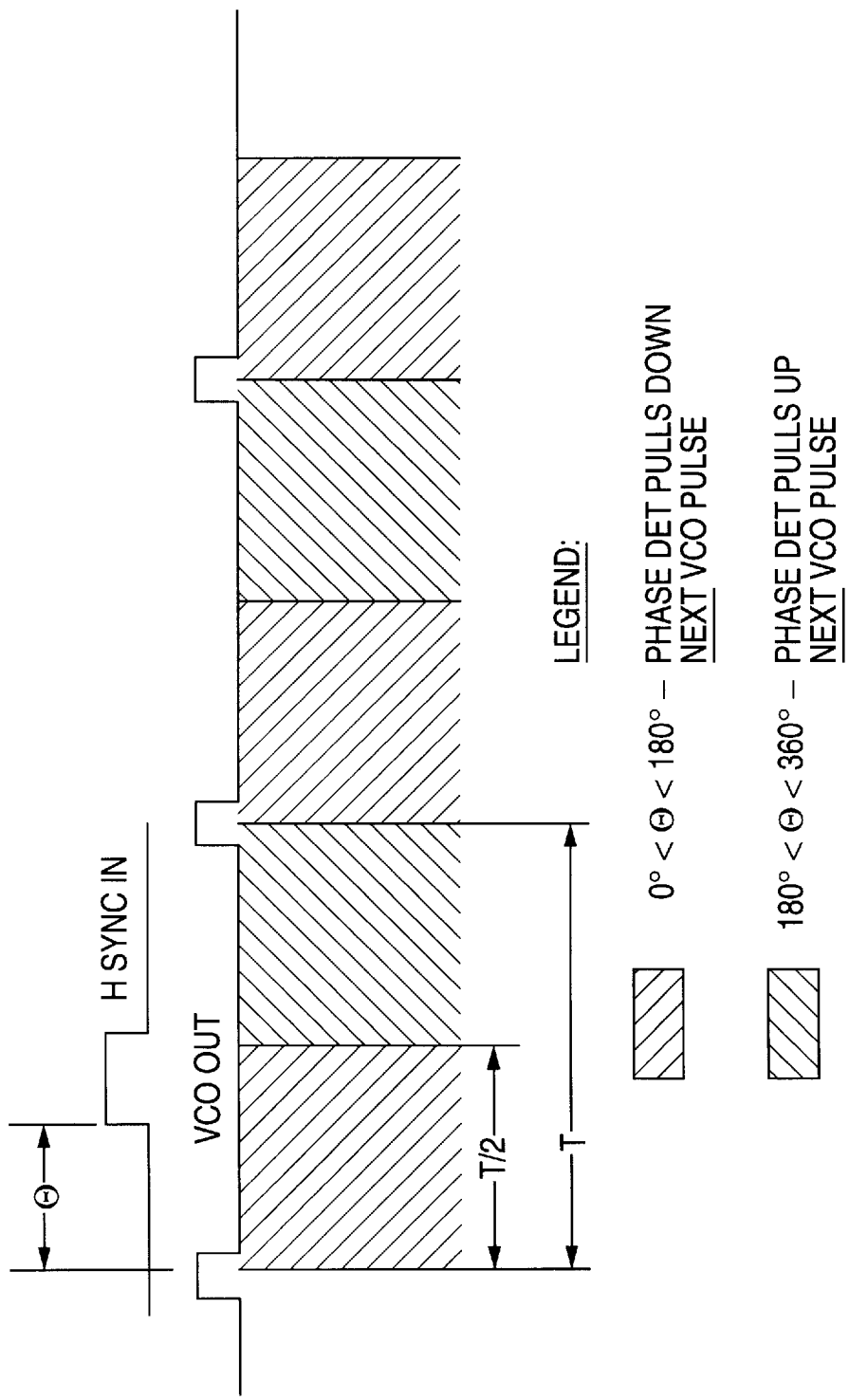
FIG. 3 is a timing diagram illustrating phase detector charge injection/removal concepts in accordance with the present invention.

FIG. 3 illustrates the operation of a phase detector in accordance with the present invention. The phase detector is enabled only during VCO pulses. However, means are undertaken to create memory, the content of which is the relative relationship between the input pulse (H SYNC IN) leading edge and the center of the VCO pulse in the previous cycle. If the phase angle θ from the VCO pulse center to the H SYNC IN leading edge is 0 deg<θ<180 deg, then the phase detector is made to remove charge at the next VCO pulse. If 180 deg<θ<360 deg, then the phase detector is made to inject charge at the next VCO pulse.

Figure 4A:
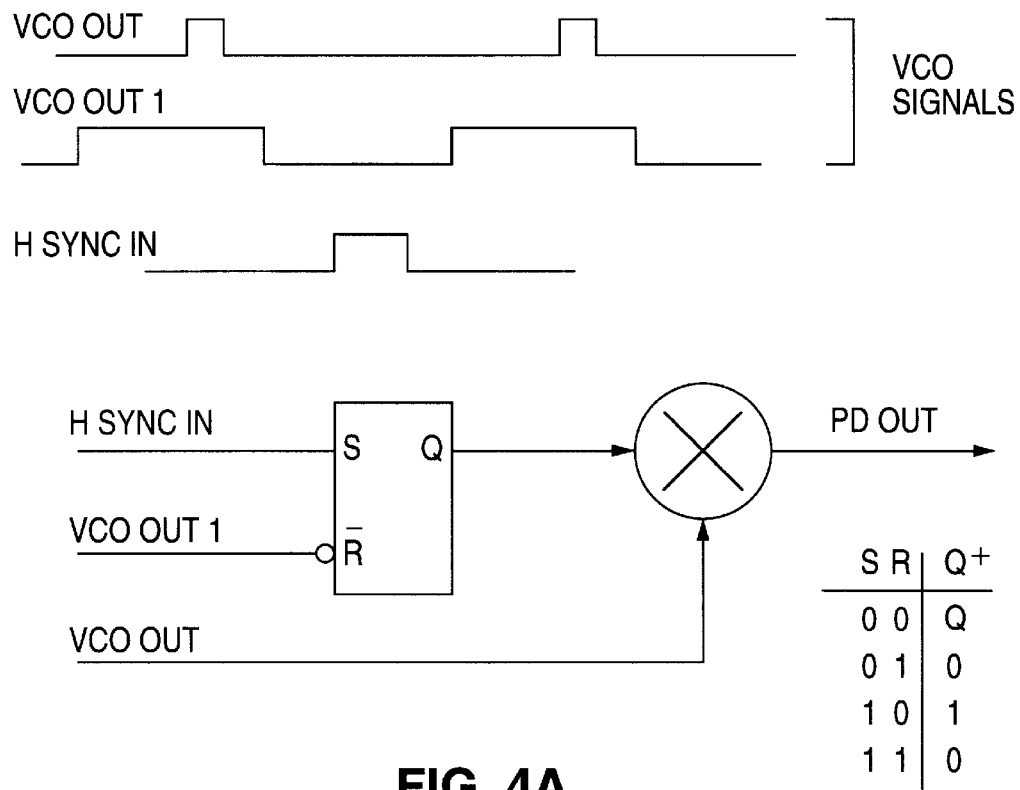
FIG. 4(a) is a block diagram illustrating a phase detector charge injection/removal circuit in accordance with the present invention.

A block diagram of the invention is shown in FIG. 4(a). The inputs to the SR latch shown in FIG. 4(a) are signals which are of independent frequency, so that the related input to the phase detector is a signal with information both from H SYNC IN, which is the independent variable, and from VCO OUT1, which is a signal derived from the VCO to exhibit the required phase relationship with VCO OUT, as shown by the signal waveforms provided at the top of FIG. 4(a). Also, note that the truth table provided in FIG. 4(a) is slightly different than the standard SR latch; i.e., the '11' input condition is not disallowed.

Figure 1A:
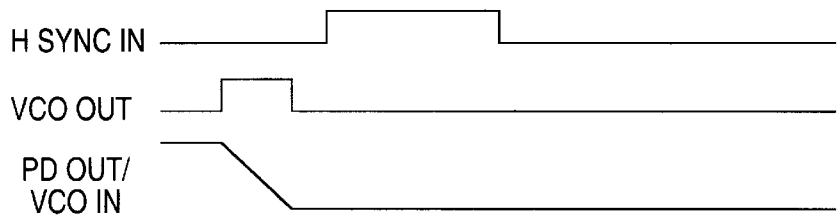
FIGS. 1(a)–1(f) provide a series of timing diagrams illustrating an out-of-lock video deflection phase locked loop using a conventional two-quadrant phase detector.
Figure 1B:
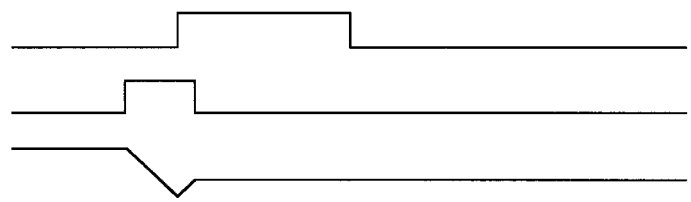
Figure 1C:
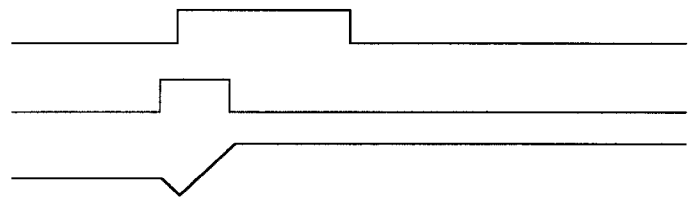
Figure 1D:
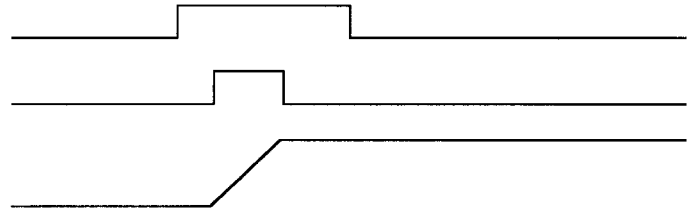
Figure 1E:
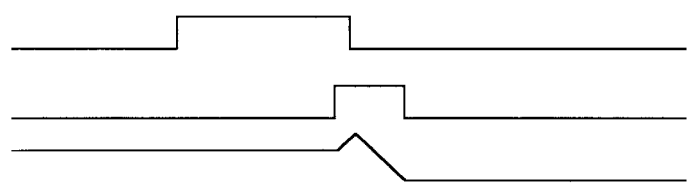
Figure 1F:
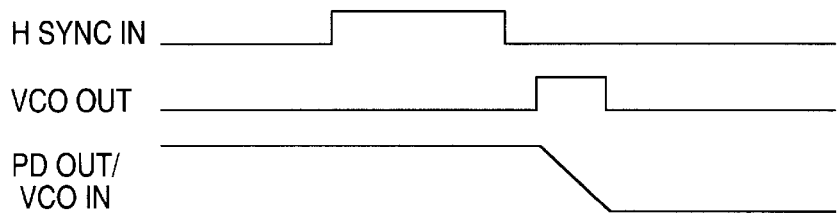
Figure 2A:
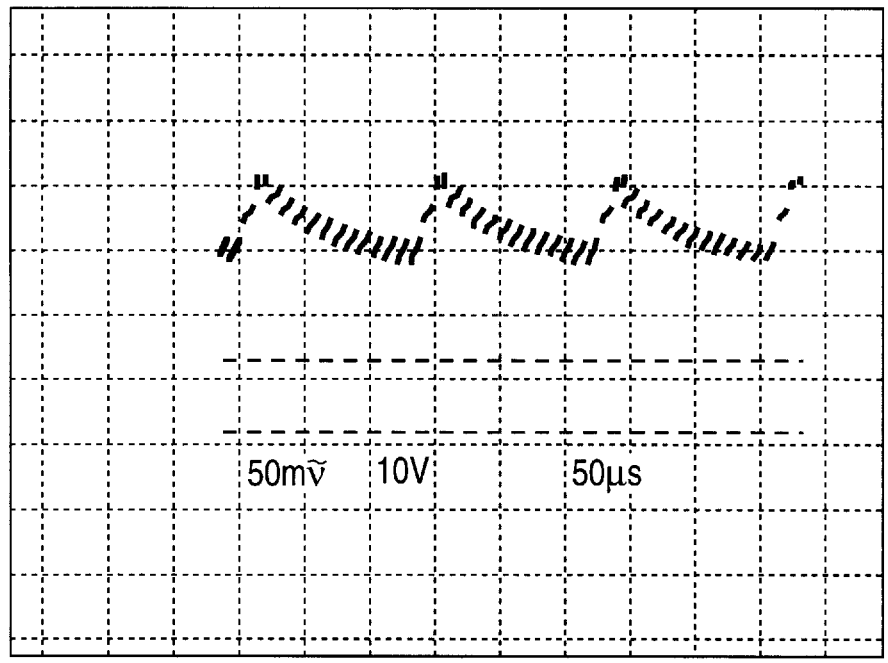
FIGS. 2(a) and 2(b) are copies of oscilloscope photographs illustrating the charge injection phenomenon shown by the FIGS. 1(a)–(f) timing diagrams.
Figure 2B:
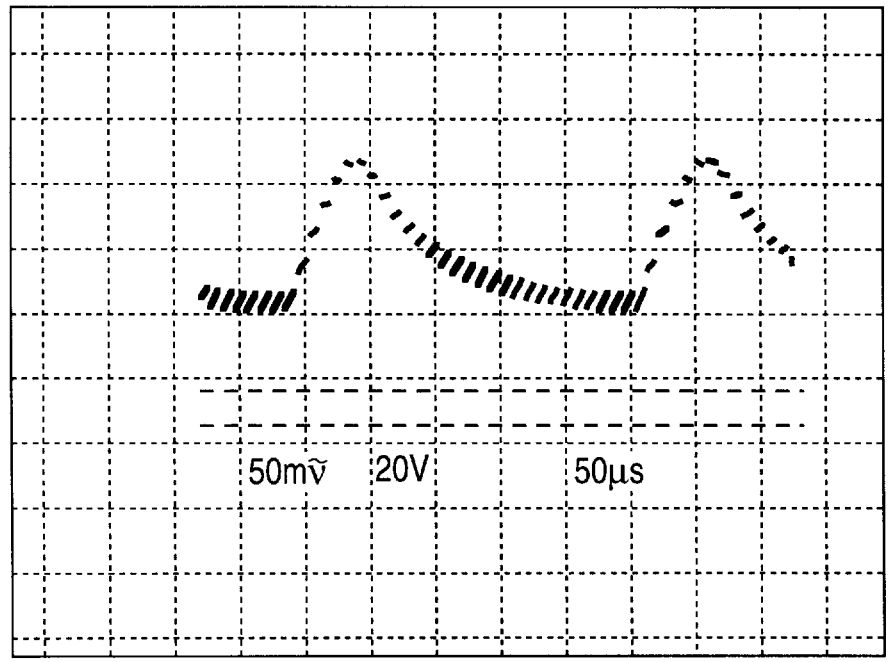
Figure 4B:
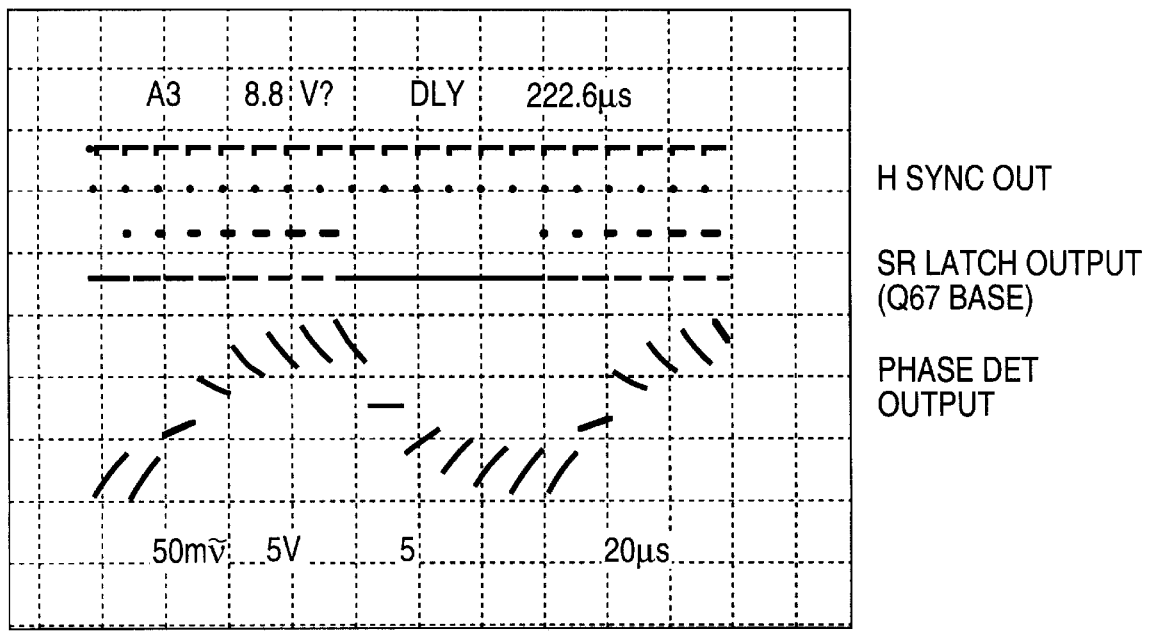
FIG. 4(b) is a copy of an oscilloscope photograph illustrating the input and output of a phase detector in accordance with the present invention.

FIG. 4(b) is a copy of an oscilloscope photograph showing the invention in operation. As in the case of the FIG. 2(a), 2(b) photos, the FIG. 4(b) photo represents the out-of-lock state of the loop. The SR latch output, which is one of the inputs to the two quadrant multiplier, shows modulated pulse widths interspersed with sections in which no pulses occur. Note that the phase detector output shows a "search pattern" which is symmetric. This implies capture range symmetry; bench tests have, in fact, proven this out. Note that although H SYNC OUT (which is the same signal as H SYNC IN, inverted) is shown in FIG. 4(b), VCO OUT is not. However, the time location of VCO pulses is easily inferred: they are marked by the light, nearly-vertical traces of the phase detector output.

Figure 4C:
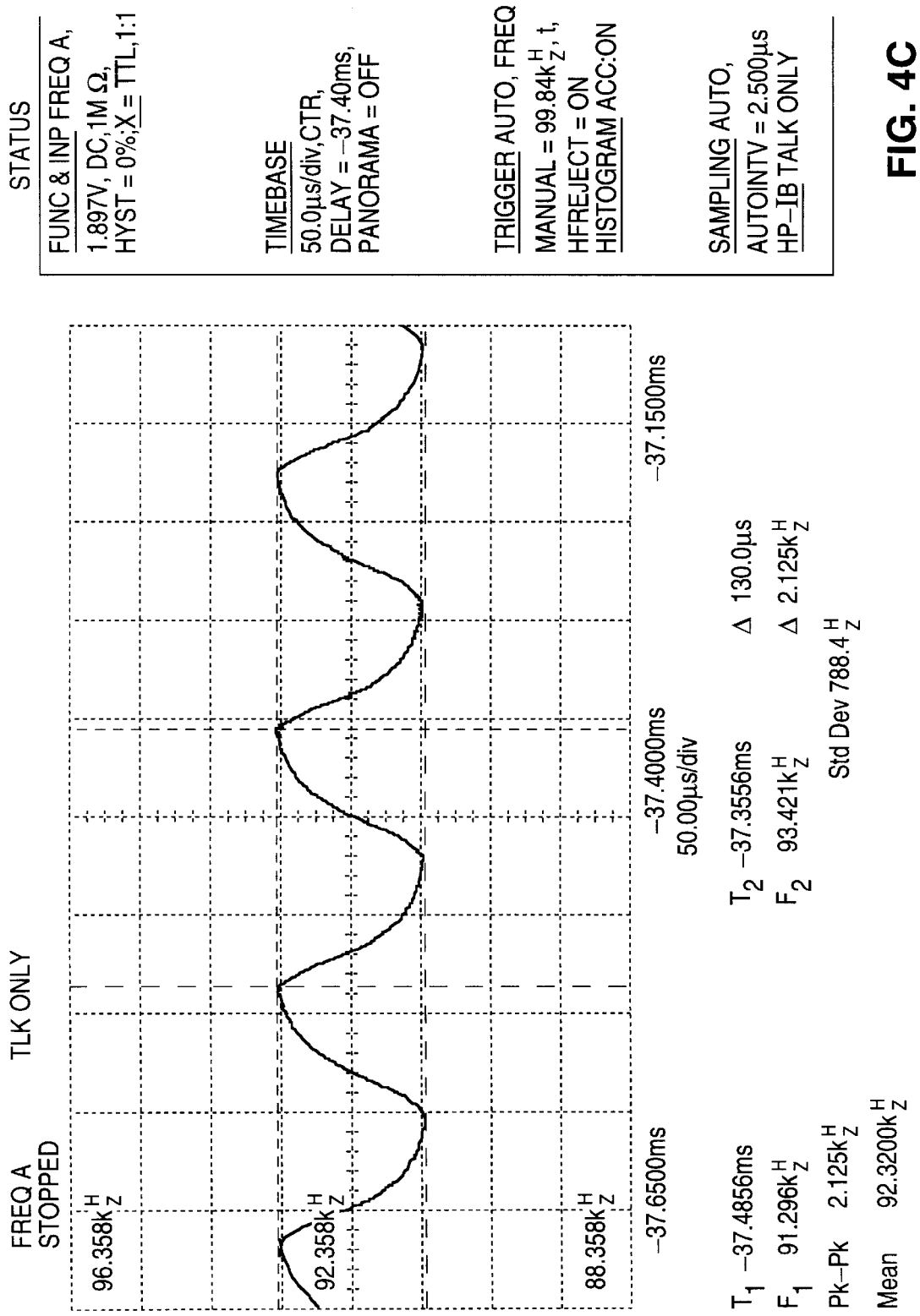
FIG. 4(c) is a waveform illustrating a VCO output corresponding to the input conditions of FIG. 4(b).

FIG. 4(c) shows the VCO output corresponding to the input conditions of FIG. 4(b); note that the FIG. 4(c) graph is of frequency vs. time.

Figure 5:
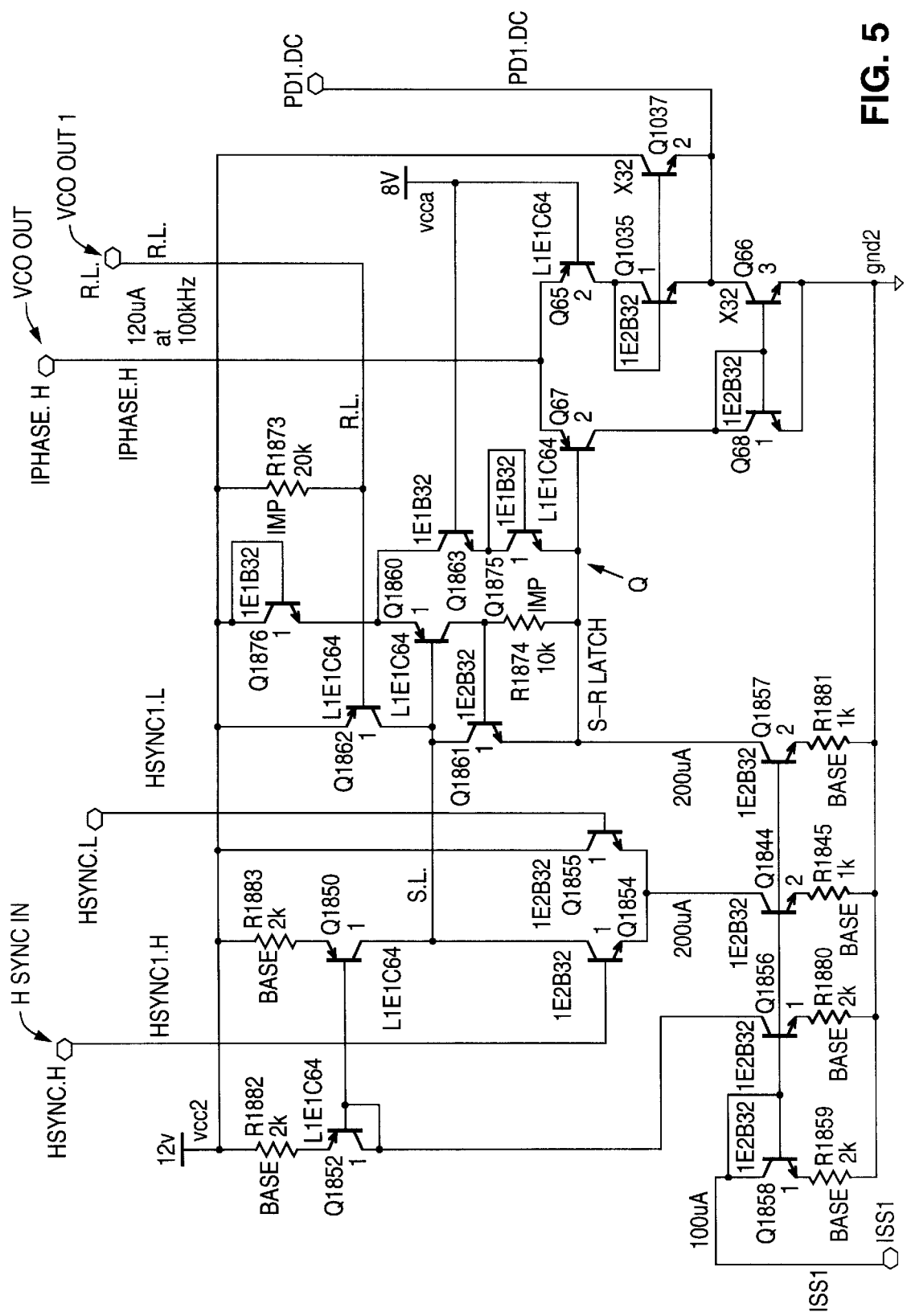
FIG. 5 is a schematic diagram illustrating an embodiment of a phase detector circuit in accordance with the present invention.

A circuit schematic embodying the invention is shown in FIG. 5. The signals H SYNC IN, VCO OUT, and VCO OUT1 from FIG. 4(a) are marked on the FIG. 5 schematic.

In FIG. 5, the two-quadrant multiplier is realized in the differential amplifier of devices Q65–Q68 and Q1035, Q1037. The VCO pulse signal VCO OUT is realized in a switched current called IPHASE.H. This is a pnp collector current, which is on during VCO pulses and off between pulses. The node at the base of pnp device Q67, marked "SR LATCH", is the output (Q) of the latch. The signal H SYNC IN is realized in differential form (HSYNC1.H and HSYNC1.L) using an npn differential pair Q1850, Q1852 with a common mode loop active load to form the signal S.L.

Signals S.L and R.L (VCO OUT1) are the active-low Set and Reset signals, respectively, for the S-R latch. The latch is reset-dominant, so that if both signals are asserted at the same time, the latch will reset, i.e., the base voltage of device Q67 will go low.

The latch itself is realized in the back-to-back pnp/npn pair Q1860, Q1861. The reset, or Q=0, state is present when both of these devices are off. The set, or Q=1, state is present when both of these devices are in saturation.

Assume that the latch output is in the Q=0 state. In this case, devices Q1860 and Q1861 are off. The current source Q1857 current is flowing through the npn string Q1876, Q1863, and Q1875, so that the latch output rests at 8V–2Vbe. The signal S.L=R.L=Vcc - Vce(sat); that is, neither S nor R is asserted. Note that this means that the base-emitter junction of pnp device Q1860 is back-biased by Vbe - Vce(sat). Thus, it is completely off.

Now let HSYNC1.H rise above HSYNC1.L, so that S.L ramps down. When S.L reaches ~Vcc - 2Vbe, pnp device Q1860 begins to turn on. When it does, a voltage drop is created across the 10 k resistor R1874 which begins to turn on device Q1861. Devices Q1860 and Q1861 form a positive feedback loop, and continue to turn on until they are both saturated, so that now Q=1. In this state, S.L=Vcc - 2Vbe, the collector voltage of device Q1860 equals Vcc - Vbe - Vce(sat), and the latch output, i.e., the base voltage of device Q67, equals Vcc - 2Vbe - Vce(sat). Clamping npn devices Q1863 and Q1875 are off, and current source Q1857 current is flowing through the path which includes resistor R1874, and devices Q1861, Q1860 and Q1876. Also, note that while S.L is asserted, the base current of device Q1860 equals 100 uA, which is the difference between the collector currents of devices Q1854 and Q1850.

Now let S.L once again become unasserted, i.e. HSYNC1.H falls below HSYNC1.L. 100 uA is forced into the collector of Q1861. However, this current is insufficient to bring this device out of saturation. Therefore, the output remains Q=1, thus truly behaving as a latch.

Now suppose that R.L becomes asserted, that is, Q1862 is turned on with sufficient base current to be driven into saturation. Pnp device Q1860 is then forcefully turned off. When this happens, device Q1861 also turns off, since the collector current of device Q1860, which had been driving its base, is now off. Thus, the latch has returned to the state Q=0. Note that since device Q1862 is in saturation, it possesses enough current drive to overcome the assertion of S.L, i.e. the net 100 uA that is sunk when device Q1854 is on. If S.L and R.L are being continually asserted, then the latch is in the Q=0, or reset, state. If R.L is then disasserted, the latch immediately goes to the Q=1, or set, state.

It should be understood that various alternatives to the embodiments of the invention described herein may be employed in practicing the invention. It is intended that the following claims define the scope of the invention and that structures and methods within the scope of there claims and their equivalents be covered thereby.

What is claimed is:

1. A phase detector in a phase locked loop circuit, wherein the phase locked loop circuit includes a loop filter that generates a loop control voltage based on a phase error signal provided to the loop filter from said phase dectector and a voltage controlled oscillator that generates an output signal pulse of the phase locked loop circuit, wherein the phase error signal represents a relative phase angle difference θ between a leading edge of an input signal pulse to the phase detector and a center of the output signal pulse, and wherein the voltage controlled oscillator responds to changes in the loop control voltage by varying a frequency of the output signal pulse, the phase detector comprising:

a latch receiving said input signal pulse and said output signal pulse that stores a value representative of the relative phase angle difference θ; and a multiplier coupled to said latch and said low pass filter that responds to the value stored in the latch and to the output signal pulse by providing said phase error signal that causes the loop control voltage to decrease when $0° < \theta < 180°$ and by providing said phase error signal that causes the loop control voltage to increase when $180° < \theta < 360°$.

2. A method of generating a phase error signal in a phase locked loop circuit, wherein the phase locked loop circuit includes a loop filter that generates a loop control voltage based on a phase error signal provided to the loop filter from said phase detector and a voltage controlled oscillator that generates an output signal pulse of the phase locked loop circuit, wherein the phase error signal represents a relative phase angle difference $\theta$ between a leading edge of an input signal pulse to the phase detector and a center of the output signal pulse, and wherein the voltage controlled oscillator responds to changes in the loop control voltage by varying a frequency of an output signal pulse, the method comprising:

storing a value representative of the relative phase angle difference $\theta$ in a latch; and mixing the stored value with the output pulse signal to provide said phase error signal that causes the loop control voltage to decrease when $0° < \theta < 180°$ and to provide said phase error signal that causes the loop control voltage to increase when $180° < \theta < 360°$.

* * * * *

UNITED STATES PATENT AND TRADEMARK OFFICE
CERTIFICATE OF CORRECTION

PATENT NO.: 5,847,582
DATED: December 8, 1998
INVENTOR(S): VICTOR P. SCHRADER ET AL.

It is certified that an error appears in the above-identified patent and that said Letters Patent is hereby corrected as shown below:

In Col. 4, line 53, delete "dectector" and replace with --detector--.

Signed and Sealed this

Sixteenth Day of March, 1999

Attest:

Q. TODD DICKINSON

Attesting Officer

Acting Commissioner of Patents and Trademarks